(12) United States Patent
Roper et al.

(10) Patent No.: US 7,131,033 B1
(45) Date of Patent: Oct. 31, 2006

(54) SUBSTRATE CONFIGURABLE JTAG ID SCHEME

(75) Inventors: Weston Roper, Shakopee, MN (US); Edward L. Grivna, Brooklyn Park, MN (US)

(73) Assignee: Cypress Semiconductor Corp., San Jose, CA (US)

( * ) Notice: Subject to any disclaimer, the term of this patent is extended or adjusted under 35 U.S.C. 154(b) by 441 days.

(21) Appl. No.: 10/176,976

(22) Filed: Jun. 21, 2002

(51) Int. Cl.
*G06F 11/00* (2006.01)

(52) U.S. Cl. .................... 714/30; 365/103; 365/174

(58) Field of Classification Search ................ 714/30; 716/10, 4; 700/116; 324/763, 764
See application file for complete search history.

(56) References Cited

U.S. PATENT DOCUMENTS

| | | | | |
|---|---|---|---|---|
| 4,558,345 A | 12/1985 | Dwyer et al. | .................. | 357/68 |
| 4,808,844 A | 2/1989 | Ozaki et al. | ................ | 307/243 |
| 4,985,641 A | 1/1991 | Nagayama et al. | ...... | 307/272.3 |
| 4,990,800 A | 2/1991 | Lee | ............................. | 307/465 |
| 5,048,021 A * | 9/1991 | Jarwala et al. | ............. | 714/727 |
| 5,119,163 A * | 6/1992 | Ishihara et al. | ............... | 365/96 |
| 5,161,124 A | 11/1992 | Love | .......................... | 361/222 |
| 5,221,890 A | 6/1993 | Shyu et al. | .................. | 323/317 |
| 5,295,110 A | 3/1994 | Sakakibara | ................ | 365/222 |
| 5,303,180 A | 4/1994 | McAdams | .................... | 365/63 |
| 5,353,250 A | 10/1994 | McAdams | ............ | 365/189.03 |
| 5,355,369 A * | 10/1994 | Greenberger et al. | ....... | 714/727 |
| 5,361,003 A | 11/1994 | Roberts | ....................... | 326/21 |
| 5,373,470 A | 12/1994 | Jones, Jr. | ............... | 365/189.05 |
| 5,379,261 A | 1/1995 | Jones, Jr. | ............... | 365/230.01 |
| 5,412,333 A | 5/1995 | Okunaga | ..................... | 327/198 |
| 5,467,304 A * | 11/1995 | Uchida et al. | .............. | 365/174 |
| 5,530,391 A | 6/1996 | Bohme et al. | .............. | 327/311 |
| 5,544,115 A | 8/1996 | Ikeda | .......................... | 365/207 |
| 5,553,022 A * | 9/1996 | Weng et al. | ........... | 365/189.01 |
| 5,589,783 A | 12/1996 | McClure | ....................... | 326/71 |
| 5,594,442 A | 1/1997 | Paulos et al. | ............... | 341/143 |
| 5,625,595 A | 4/1997 | Ikeda | ......................... | 365/194 |
| 5,642,307 A * | 6/1997 | Jernigan | ...................... | 365/103 |
| 5,646,451 A | 7/1997 | Freyman et al. | ............ | 257/784 |
| 5,682,105 A | 10/1997 | Fujima | ........................ | 326/30 |
| 5,751,173 A | 5/1998 | McMahon et al. | .......... | 327/170 |
| 5,754,879 A | 5/1998 | Johnston | ................ | 395/800.39 |
| 5,787,012 A * | 7/1998 | Levitt | ............................ | 716/1 |

(Continued)

OTHER PUBLICATIONS

"A Novel Robust and Low Cost Stack Chips Package and Its Thermal Performance", By Soon-Jin Cho et al., IEEE Transaction on Advanced Packaging, vol. 23, No. 2, May 2000, pp. 257-265.

(Continued)

*Primary Examiner*—Robert Beausoliel
*Assistant Examiner*—Philip Guyton
(74) *Attorney, Agent, or Firm*—Christopher P. Maiorana, PC

(57) ABSTRACT

A circuit generally comprising a core circuit and a test access port circuit. The core circuit may be configurable among a plurality of functions in response to a signal. The test access port circuit may be configured to determine an identification value in response to the signal.

19 Claims, 9 Drawing Sheets

U.S. PATENT DOCUMENTS

| | | | | |
|---|---|---|---|---|
| 5,831,925 | A | 11/1998 | Brown et al. | 365/230.03 |
| 5,880,596 | A | 3/1999 | White | 326/38 |
| 5,896,404 | A | 4/1999 | Kellogg et al. | 371/40.11 |
| 5,920,227 | A | 7/1999 | An | 327/544 |
| 5,926,053 | A | 7/1999 | McDermott et al. | 327/298 |
| 5,982,043 | A | 11/1999 | Iwata | 257/786 |
| 6,034,539 | A | 3/2000 | Hwang | 326/38 |
| 6,111,441 | A | 8/2000 | Hartley et al. | 327/143 |
| 6,161,213 | A * | 12/2000 | Lofstrom | 716/4 |
| 6,225,818 | B1 * | 5/2001 | Park et al. | 324/763 |
| 6,324,088 | B1 | 11/2001 | Keeth et al. | 365/51 |
| 6,378,090 | B1 * | 4/2002 | Bhattacharya | 714/724 |
| 6,525,560 | B1 * | 2/2003 | Trimberger et al. | 326/38 |
| 6,581,190 | B1 * | 6/2003 | Dixon et al. | 716/4 |
| 6,600,686 | B1 * | 7/2003 | Huh et al. | 365/201 |

OTHER PUBLICATIONS

"A Compact V-Band 3-D MMIC Single-Chip Down-Converter Using Photosensitive BCB Dielectric Film", By Kenjiro Nishikawa et al., IEEE Transactions on Microwave Theory and Techniques, vol. 47, No. 12, Dec. 1999, pp. 2512-2518.

"A 6.8ns 1Mb ECL I/O BiCMOS Configurable SRAM", By Bob Kertis et al., 1990 Symposium on VLSI circuits, pp. 39-40.

"IEEE Standard Test Access Port and Boundary-Scan Architecture", IEEE Std. 1149.1-2001, Jul. 23, 2001, pp. 1-200.

* cited by examiner

US 7,131,033 B1

SUBSTRATE CONFIGURABLE JTAG ID SCHEME

FIELD OF THE INVENTION

The present invention relates to a method and/or architecture for configurable chips generally and, more particularly, to configurable chips having a configurable test access port identification value.

BACKGROUND OF THE INVENTION

Memory devices commonly support multiple Joint Test Action Group (JTAG) product identification values by using a unique identification value for individual derivative products. The "hooks" required to enable the derivative product identification values are designed into a base chip such that only a unique metal layer is required to distinguish each derivative product. Other semiconductor devices commonly establish the JTAG identification values (hereinafter referred to as JTAG ID) through wire bonding of the die pads and an on-die product identifier encoder.

Using the unique metal layer to form the JTAG ID value means that the chips are physically different for each derivative product. Having several unique chip designs increases design, manufacturing, test, and qualification costs, and requires a staffed design team to make the derivative products. Furthermore, developing unique metal layers for derivative products require a design team. If each derivative product used the same chip without a unique metal layer, the derivative product development becomes a back-end project that is both simpler and lower in cost than a design project.

SUMMARY OF THE INVENTION

The present invention concerns a circuit generally comprising a core circuit and a test access port circuit. The core circuit may be configurable among a plurality of functions in response to a signal. The test access port circuit may be configured to determine an identification value in response to the signal.

The objects, features and advantages of the present invention include providing a method and/or architecture for configurable chips that may provide (i) a common chip useful for multiple derivative products, (ii) a configurable test access port identification value, (iii) a reduction from conventional overhead costs and/or (iv) a reduction in a conventional project development cycle.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
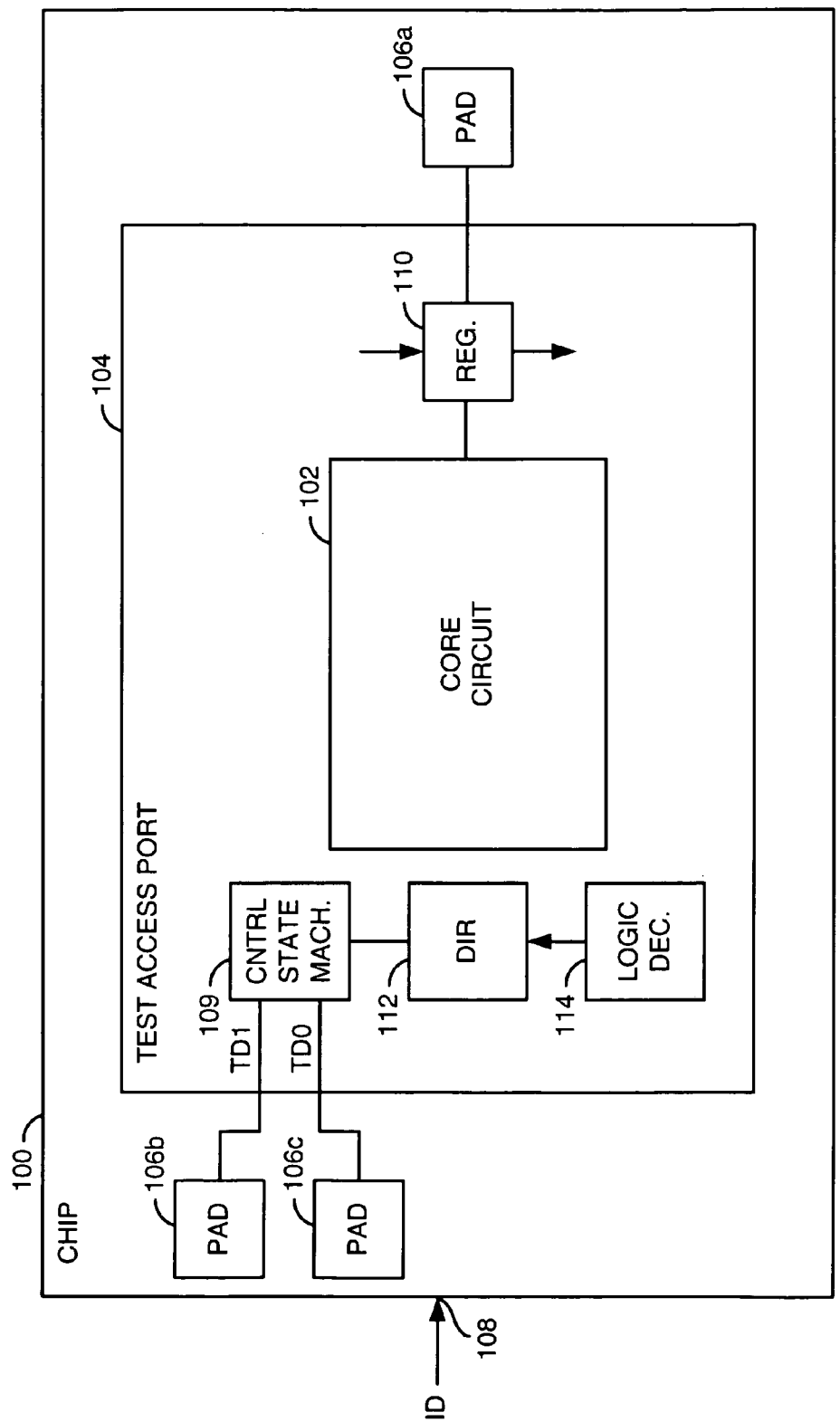
FIG. 1 is a block diagram of an apparatus in accordance with a preferred embodiment of the present invention.

Referring to FIG. 1, a block diagram of an apparatus 100 is shown in accordance with a preferred embodiment of the present invention. The apparatus 100 may be implemented as an integrated circuit, die or chip having a test access port capability. Multiple derivative products having different functionality may be created from a single design of the chip 100 or a collection of multiple chips 100 in or on a common package or substrate. The present invention generally enables each of the multiple derivative products to generate and present a unique JTAG ID value through the test access port capability.

The test access port capability may be compliant with the Joint Test Action Group (JTAG) architecture. The JTAG architecture may be defined by the IEEE Standard 1149.1-2001, titled "IEEE Standard Test Access Port and Boundary-Scan Architecture", published by the IEEE, New York, N.Y. and hereby incorporated by reference in its entirety. Other test access port and boundary scan architectures may be implemented to meet the design criteria of a particular application.

The JTAG architecture generally specifies a 32-bit identification register having four sections. A first section generally comprises the four most significant bits (e.g., bits 28–31). The first section may identify a version number of the chip 100 as determined by a manufacturer. A second section generally comprises the next sixteen bits (e.g., bits 12–27). The second section may identify a part number determined by the manufacturer. A third section generally comprises the next eleven bits (e.g., bits 1–11). The third section may define an identity of the manufacturer. The manufacturer identification values may be defined by the Joint Electron Device Engineering Council. The fourth section generally comprises a least significant bit (e.g., bit 0). The fourth section may be hard-wired to a logical one.

The chip 100 generally comprises a core circuit 102, a test access port circuit 104, and multiple pads 106a–c (only three shown for clarity). An input 108 may be provided in the chip 100 to receive a signal (e.g., ID) from an external source. The signal ID may be implemented as an identification signal having one or more bits of information.

The core circuit 102 may be generally configured to perform multiple functions based upon the signal ID. Some functions may be performed in parallel while other functions may be mutually exclusive. By generating an appropriate value for the signal ID, the core circuit 102, and thus the chip 100 may be configured to behave as one of the many different products.

The test access port circuit 104 generally comprises a control state machine 109, multiple boundary scan registers 110 (only one shown for clarity), and a device identification register 112. Generally, there may be one register 110 for each pad 106 that transfers data. The registers 110 may be connected in series forming a boundary scan chain. The boundary scan chain may include a test data input signal (e.g., TDI) and a test data output signal (e.g., TDO) as defined by the IEEE Standard 1149.1-2001. The device identification register 112 may be coupled into the boundary scan chain, as directed by the control state machine 109, to allow a content (e.g., JTAG ID) to be serially clocked out of the chip 100 through the signal TDO.

The signal ID may be generated externally and then presented to or programmed into the chip 100. Programming may be through a memory circuit or a one-time programmable circuit or element. The signal ID may enable the JTAG ID to be configured by one or more of the following possible forms:

A package substrate where the substrate for each product defines a unique electrical functionality and a unique associated JTAG ID value or address.

Alternate combinations of chip-to-package-substrate bond wires.

Bond wires on the substrate that may not directly connect to the chip.

Alternate connections of the chip to the package substrate where the chip may be tab or flip-chip bonded to the substrate.

Alternate combinations of package substrate connections that may be made to a user circuit board through package pins, package balls, package posts, contact bumps, and/or other conductive pads including land grid arrays.

An on-chip boot read-only memory (ROM), programmable ROM, electronically programmable ROM, electronically erasable programmable ROM, magnetoresistive random access memory (MRAM), battery-backed random access memory (RAM), and/or other nonvolatile storage.

A separate die boot ROM contained in the same package as the chip 100.

An electrically, optically (e.g., laser) and/or thermally programmable fusible link.

An electrically, optically (e.g., laser) and/or thermally programmable antifuse link.

An electrically, optically, or magnetically programmable storage element or memory circuit on the chip.

As an example, a single chip 100 may be mounted to a common substrate to fabricate several different products. The functionality and associated JTAG ID values may be selected through different wire bonding of the chip 100 to the common substrate. The same change in functionality and JTAG ID value may also be implemented using a common wire bonding scheme but with a substrate containing different electrical connectivity.

The JTAG ID value may be unique for a given product. By connecting one or more bits of the device identification register 112 to input pads 106a–106c (individually and collectively also referred to as pads 106), memory circuits (FIG. 6), one-time programmable circuits (FIG. 7), and/or a logic decoder circuit 114 receiving the signal ID, or any combination thereof, the bits in the device identification register 112 may be configured with no change to the logic, diffusions, or metalizations of the chip 100. The design approach generally enables derivative products having test access port functionality to be developed using a common chip 100. An improvement may be realized in cost savings and design time reduction, achieved by having (i) a single chip 100, (ii) a single set of masks, and (iii) a single wafer probe test program for all derivatives.

Figure 2:
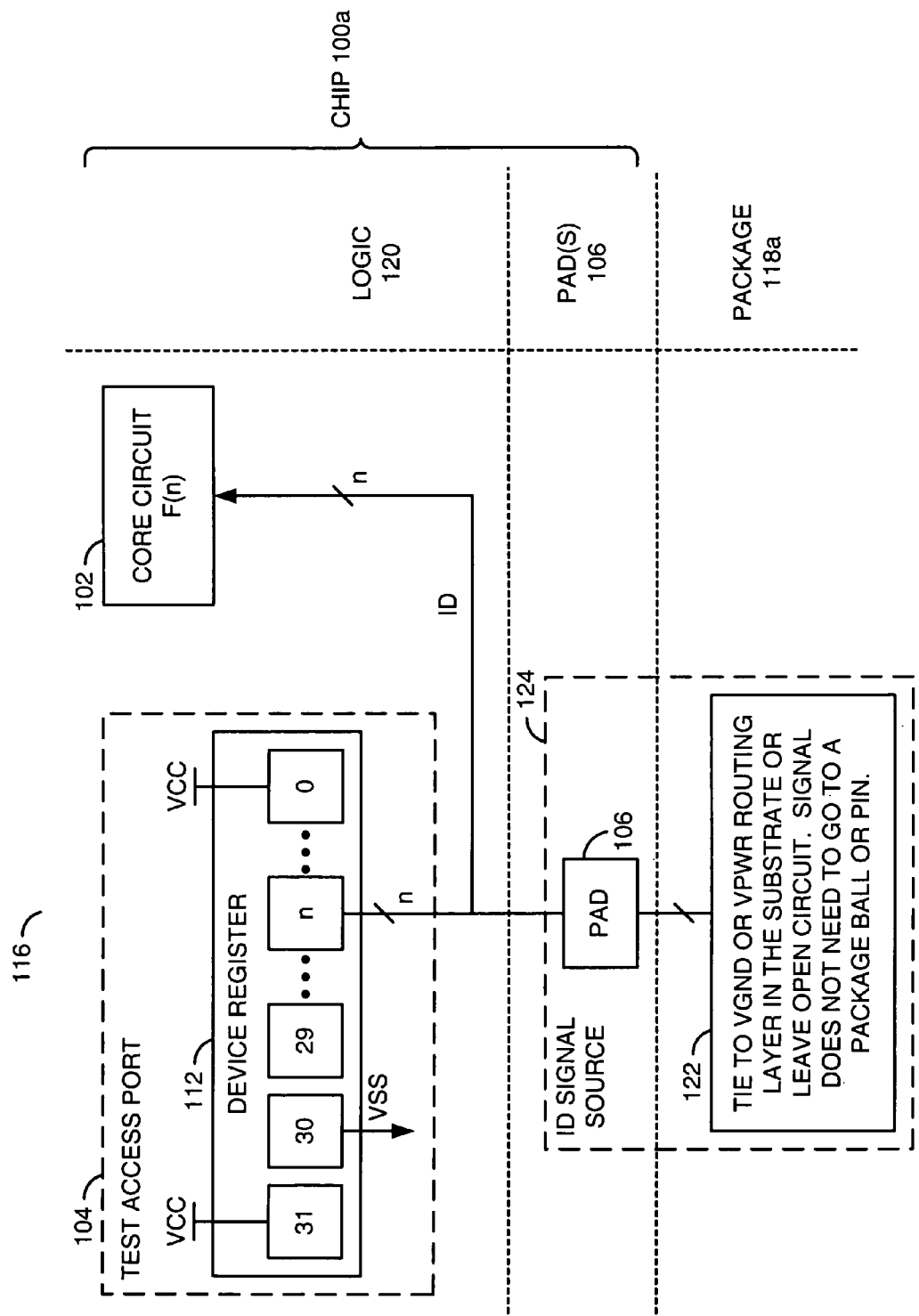
FIG. 2 is a block diagram of a first example device.

Referring to FIG. 2, a block diagram of a first example device 116 is shown. The device 116 generally comprises a chip 100a and a package 118a. The chip 100a may be represented as logic circuits 120 and the pads 106. The logic circuits 120 may include the core circuit 102 and the test access port circuit 104.

The package 118a may have components 122 configured to generate a value for the signal ID. The value of the signal ID may be represented by 'n' bits, where 'n' may be an integer of one or more. The signal ID may be carried to the logic circuits 120 through the pads 106. A combination of the pads 106 and the components 122 may form a source circuit 124 for the signal ID. In one embodiment, the source circuit 124 may be totally contained within the chip 100a and programmed to store the signal ID value.

The signal ID may be routed to the device identification register 112 within the test access port circuit 104. The signal ID may also be routed to the core circuit 102. Each of the 'n' bits of the signal ID may be used to configure one or more bits within the device identification register 112. Generally, the 'n' bits of the signal ID may be used to establish the bits within the second section of the device identification register 112. Bits within the first and third sections of the device identification register 112 may be set through a power signal (e.g., VCC) or a ground signal (e.g., VSS), however, for applications where multiple manufacturers create duplicate devices (e.g., a second source) using the same set of masks, this third section may also be modified by the signal ID. The least significant bit of the device identification register 112 may indicate a logic one. As such, the signal ID may form a part of the JTAG ID value.

Figure 3:
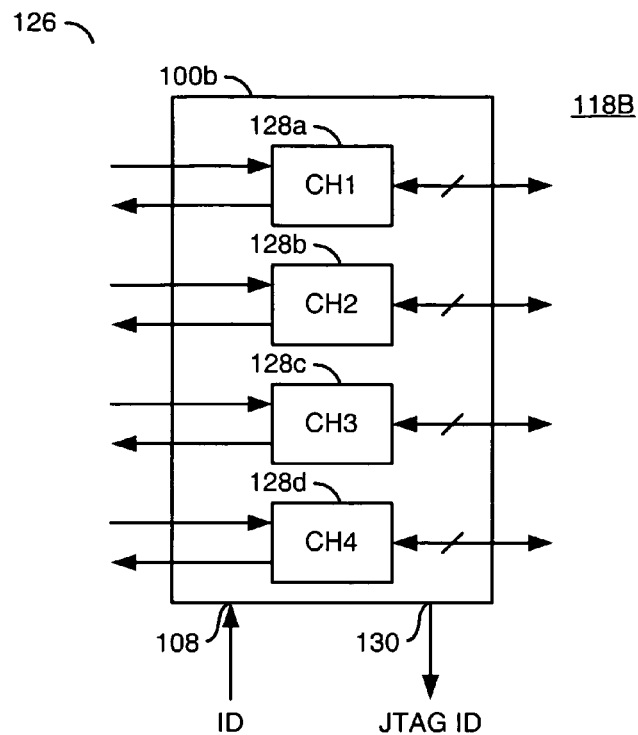
FIG. 3 is a block diagram of a second example device.

Referring to FIG. 3, a block diagram of a second example device 126 is shown. The device 126 generally comprises a chip 100b and a package 118b. The chip 100b may have multiple communication blocks or circuits 128a–d. Each circuit 128a–d may provide a serialization/deserialization (SERDES) function independently of each other. The circuit 126 may receive the signal ID and may generate the JTAG ID value in response to said signal ID.

The circuit 126 may be configured as a first product by appropriate generation of the signal ID to a first value. The chip 100b of the first product may be configured to operate as a quad-channel SERDES circuit. When queried through a JTAG test access port 130, the first product may present a first JTAG ID value based upon the signal ID value.

A second product may be fabricated from the same chip 100b through a second value of the signal ID. For example, the second product may be configured to operate as a dual-SERDES circuit. Reading the device identification register 112 from the second product may produce a second JTAG ID value different from the first JTAG ID value. As such, the same chip 100b, and possibly the same package 118b, may be used to produce two unique parts having unique functionality and unique JTAG ID values.

The chip 100b may be used to create a third product operational as a single-channel SERDES circuit or part. By using a third value for the signal ID, the third part may configure a single communication circuit 128a to operate. Simultaneously, the test access port circuit 104 of the third part may present a third JTAG ID value different from the first and the second JTAG ID values for the first and the second circuits.

Various product lines may be implemented using a single chip 100 to meet the design criteria of a particular application. For example, a chip 100 may be used to implement two, three, four, or many different products. In some cases, multiple programmable chips 100 may be mounted inside a common package and configured by the signal ID to operate as different products.

Each product within a line of products may use a common package 118 or a unique package 118. Common packages 118 may help reduce costs for fabricating the different products since common equipment, fabrication procedures, testing and validation may be used for each product. Having a simpler inventory of substrates or packages 118 may also reduce overall costs. Unique packages 118 may be used during fabrication to meet specific design goals and/or meet customer needs. For example, where the chip 100b may be configured as a single-channel SERDES part, the chip 100b may be enclosed in a smaller package 118 with a smaller pin-count to reduce a footprint of the single-channel product as compared with the quad-channel product.

A further advantage of the present invention may occur where the chip 100 or the entire product may be manufactured by a second source. Since the signal ID may be used to configure some of the bits in the third section of the device identification register 112, chips 100 and products from a second manufacturer may still report a unique manufacturer identification within the JTAG ID value. As such, multiple identical parts from multiple manufacturers may be distinguishable from each other through respective JTAG ID values.

Figure 4:
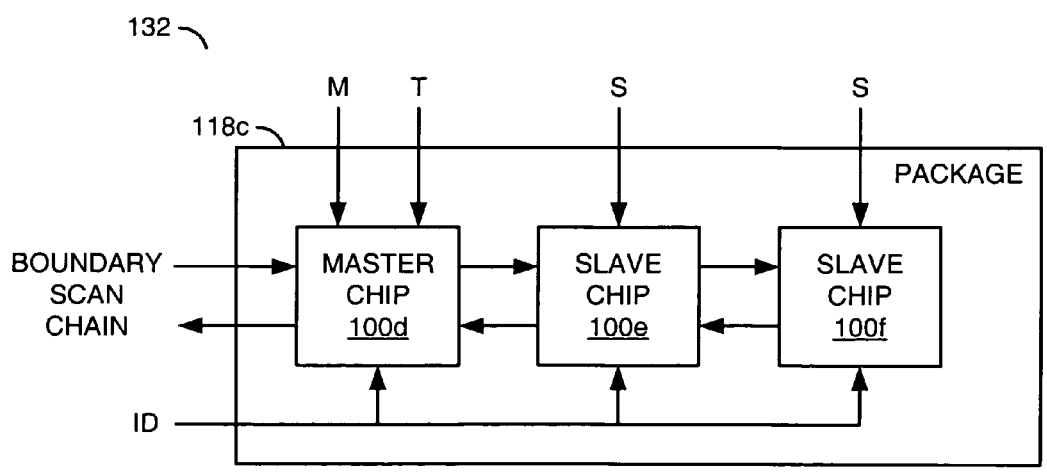
FIG. 4 is a block diagram of a third example device having multiple chips.

Referring to FIG. 4, a block diagram of a third example device 132 having multiple chips 100d–f is shown. All of the chips 100d–f may be mounted in a common package 118c. The boundary scan chains of each chip 100d–f may be connected in series to form a single boundary scan chain for the entire device 132. Each of the chips 100d–f may receive the signal ID.

The chips 100d–f may be identical to each other in some products. In other products, the various chips 100d–f may have different designs. At least one of the chips 100d–f may have a test access port compliant design. Some of the chips 100d–f may not have a boundary scan capability. In one embodiment, at least one of the chips 100d–f within the package 118c may not be JTAG capable as a stand-alone die, but may be configurable into a single scan chain when used with a die having a compliant JTAG test access port (TAP) controller (e.g., containing the data in/data out, clock and mode select functionality, but not having an active JTAG ID or device identification register 112).

One of the chips, for example chip 100d, may operate as a master for the test access port functionality. The other chips 100e and 100f may operate as slaves for the boundary scan functions. Each chip 100d–f may therefore have an input to receive a signal that instructs the chip behave as a master (e.g., M) or a slave (e.g., S). The master chip 100d may also receive a signal (e.g., T) that indicates how many chips 100d–f may be mounted in the package 118c.

The device identification register 112 of the master chip 100d may be configured to report a JTAG ID value or address for the entire device 132. The slave chips 100e–f may be configured to suppress reporting a JTAG ID value to avoid any conflicts or redundancy. The JTAG ID value may be unique for each product created from the device 132 based upon the value of the signal ID and the signal T.

Figure 5:
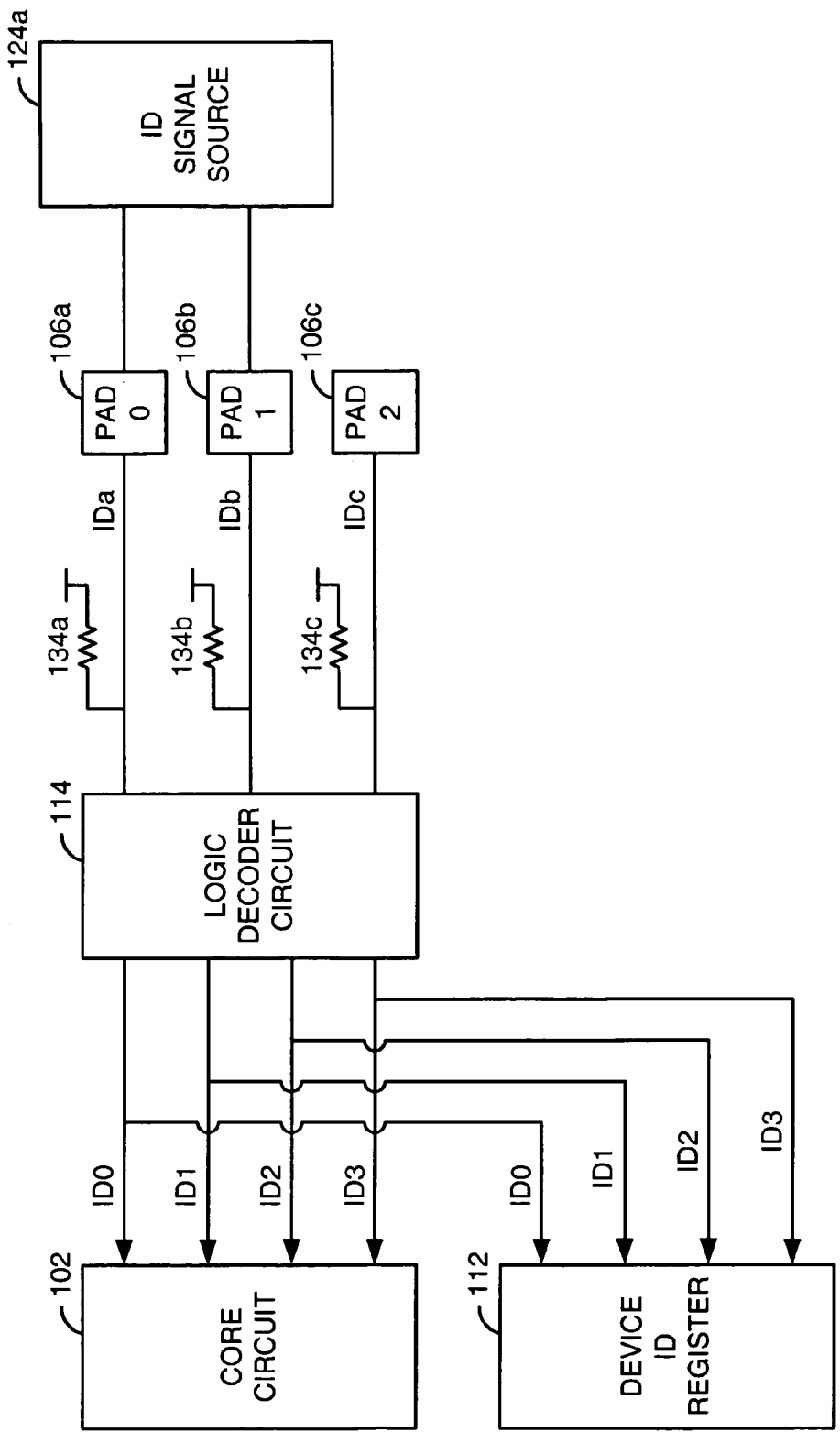
FIG. 5 is a block diagram illustrating an example use of a logic decoder circuit.

Referring to FIG. 5, a block diagram illustrating an example use of a logic decoder circuit 114 is shown. A signal ID may be received by two pads 106a–b on the chip 100 as a two-bit signal (e.g., IDa and IDb). A third pad 106c may be left unconnected. Resistor 134a–c may be provided for each respective pad 106a–c to pull-up the signals IDa–c to a logical one (shown) or pull-down to a logical zero. Since the pad 106c may not be connected to a source circuit 124a, the signal IDc may be biased to a logical one by the resistor 134c. The resistors 134a–c may be an integral part of the pads 106a–c or separate from the pads 106a–c. The resistors 134a–c may reduce the number of bonds or connections made between the pads 106a–c and the source circuit 124a of the signal ID. In one embodiment, the pads 106a–106c may be configured to allow a three-level select.

The individual signals IDa–c may be modified by the logic decoder circuit 114 to generate a four-bit signal IDn where n is an integer value such that $0 \leq n \leq 3$ (e.g., ID0 through ID3). The logic decoder circuit 114 may map the eight possible combinations of the signals IDa–c into sixteen possible values for the signals ID0–3. Therefore, a few bits received by the pads 106 may be used to configure more bits in the JTAG ID value. In another embodiment, the logic decoder circuit 114 may map more possible values of the signals IDa–c into fewer possible values for the signal ID0–3. In another embodiment, each IDn signal generated by the decoder 114 may connect to more than one bit of the device identification register 112.

Figure 6:
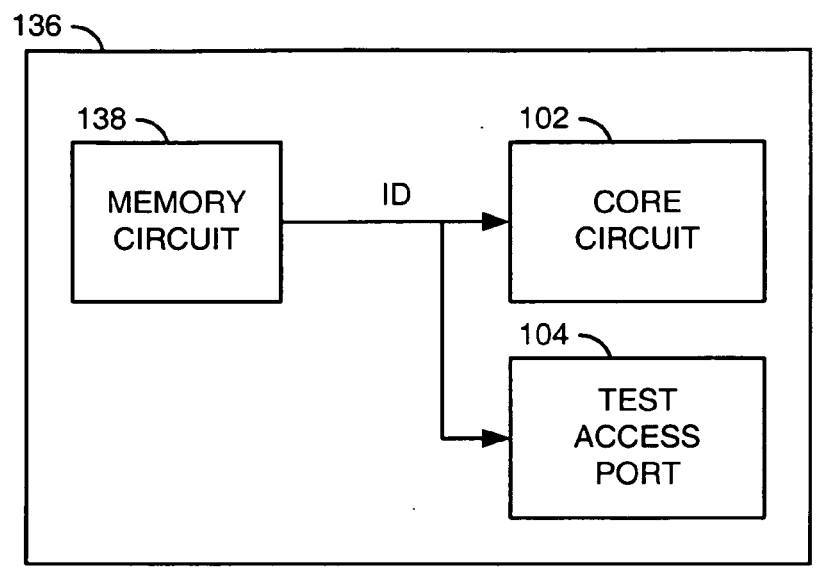
FIG. 6 is a block diagram of a fourth example device.

Referring to FIG. 6, a block diagram of a fourth example device 136 is shown. The device 136 generally comprises the core circuit 102, the test access port circuit 104, and a memory circuit 138. The signal ID value may be read from the memory circuit 138 following an application of power to the device 136. Programming of the signal ID into the memory circuit 138 may be performed by conventional processes. The memory circuit 138 is generally a nonvolatile type memory. Memory technologies including, but not limited to, read-only memory (ROM), programmable ROM, electrically programmable ROM, ultraviolet erasable EPROM, electrically erasable programmable ROM, FLASH memory, magnetoresistive random access memory (MRAM), battery-backed random access memory (RAM), ferromagnetic memory, bubble memory, and/or core memory. In another application, the device JTAG ID may be programmed electrically, optically, or magnetically into nonvolatile yet electrically, optically, or magnetically alterable memory.

The memory circuit 138 may be fabricated within the chip 100 or on a separate die external to the chip 100. Where the memory circuit 138 may be external to the chip 100, both the memory circuit 138 and the chip 100 may be enclosed in a common package 118. Reading the signal ID from the memory circuit 138 may be performed in a serial or parallel form as needed by the specific application.

Figure 7:
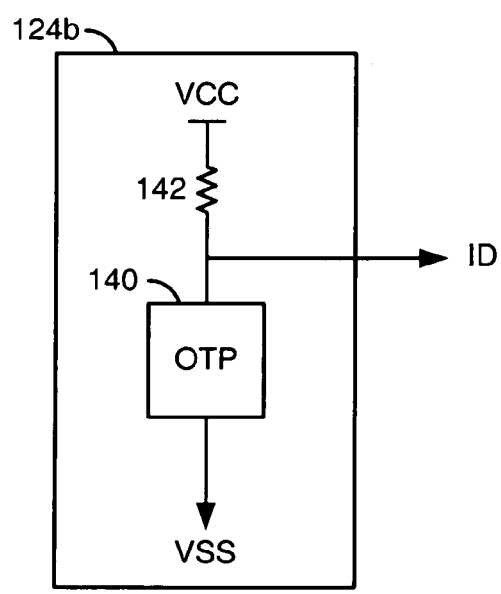
FIG. 7 is a block diagram of an example on-die source circuit.

Referring to FIG. 7, a block diagram of an example on-die source circuit 124b for generating the signal ID is shown. The on-die source circuit 124b may comprise one or more one-time programmable links 140. A resistor 142 may be provided for each one-time programmable link 140. Each resistor 142 may be configured to pull a respective bit of the signal ID either high or low, depending upon a particular design. The one-time programmable links 140 may be implemented as fuses, antifuses, or the like.

The on-die source circuit 124b generally allows the JTAG ID value for a device to be programmed into the chip 100 after all normal die processing and test steps have been completed. Programming may be accomplished by blowing on-die fuses 140 either through laser ablation or high-currents through the fuse 140 to cause electrical separation of the two ends of the fuse 140. Similar programming may also be performed for an antifuse 140 that may start as an effective open circuit that may be changed to an electrical short through electrical or optical programming.

Figure 8:
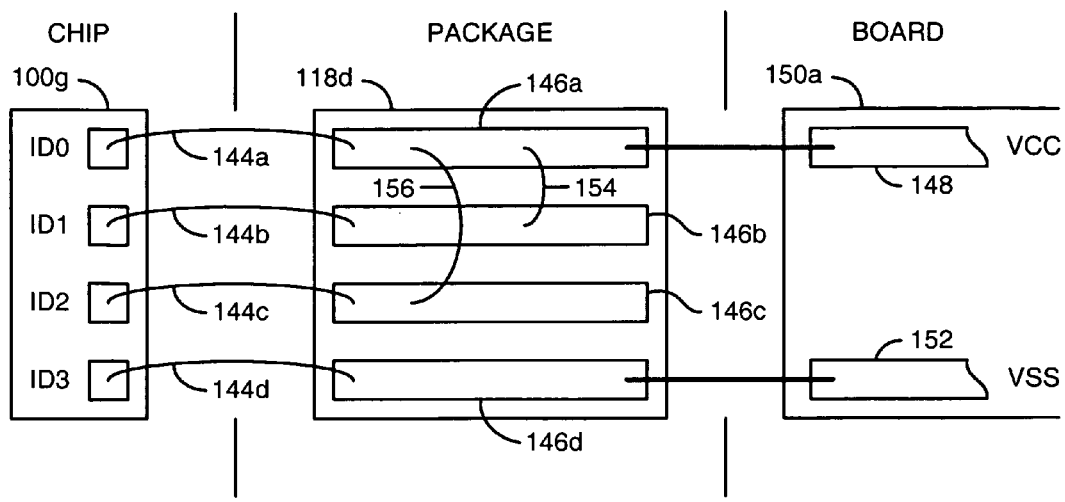
FIG. 8 is a first example structure for configuring an identification signal.

Referring to FIG. 8, a first example structure for configuring the signal ID is shown. A chip 100g may receive a four-bit signal ID directly through bonds 144a–d to a package 118d. The bonds 144a–d may be implemented as wire bonds, solder bumps, tab connections, beam leads, or similar structures.

The package 118d may have a signal trace 146a–d connected to each respective bond 144a–d. A particular signal trace, for example trace 146a, may be connected to a reference trace 148 on a board 150a. The reference trace 148 may be a power trace carrying a reference or power signal (e.g., VCC). Another signal trace, for example trace 146d, may be connected to another reference trace 152 on the board 150a. The reference trace 152 may be another power or ground trace carrying another power or ground signal (e.g., VSS).

By applying the power signal VCC to the power trace 148, the first bit ID0 of the signal ID may be configured to the logical one value. Applying the ground signal VSS to the ground trace 152 may configure the fourth bit ID3 of the signal ID to the logical zero value. The second bit ID1 may be configured by installing a wire bond or other suitable jumper 154 between the signal trace 146b and one of the signal traces 146a (shown) or 146d, biased by the board 150a to a reference level. The third bit ID2 of the signal ID may be configured by installing another wire bond 156 between the signal trace 146c and one of the signal traces 146a (shown) or 146d. Other arrangements of the wire bonds 154 and 156 may be implemented to configure a particular signal ID value.

Figure 9:
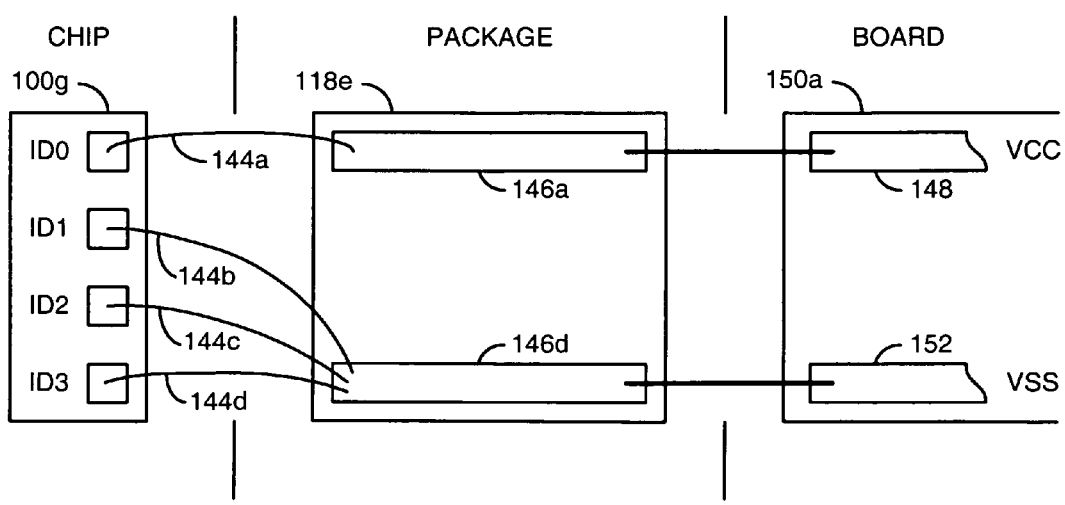
FIG. 9 is a second example structure for configuring the identification signal.

Referring to FIG. 9, a second example structure for configuring the signal ID is shown. A package 118e may have two signal traces, in particular traces 146a and 146d. The signal trace 146a may carry a logical one value received from the power trace 148. The signal trace 146d may carry a logical zero value received from the ground trace 152. The individual bits ID0–3 of the signal ID may be configured by appropriate bonds 144a–d to the signal traces 146a and 146d. For example, the bond 144a may carry the logical one value from the signal trace 146a to the chip 100g as the first bit ID0. The bonds 144b–d may carry the logical zero value from the signal trace 146d to the chip 100g as the bits ID1–3.

Figure 10:
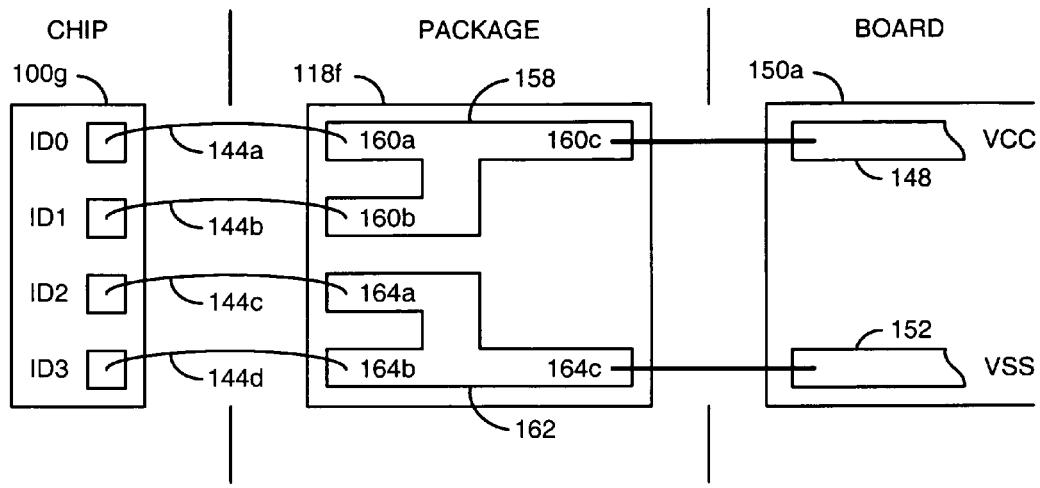
FIG. 10 is a third example structure for configuring the identification signal.

Referring to FIG. 10, a third example structure for configuring the signal ID is shown. A package 118f may have a trace 158 having three bonding areas 160a–c. Another trace 162 may also have three bonding areas 164a–c. The bonds 144a–d may be connected to the bonding areas 160a, 160b, 164a and 164b respectively. The bonding area 160c may connect to the power trace 148. The bonding area 164c may connect to the ground trace 152. As a result, the bits ID0–1 of the signal ID may be set to the logical one value and the bits ID2–3 may be set to the logical zero value. Other layouts of the traces 158 and 162 may be provided to generate a particular signal ID value.

Figure 11:
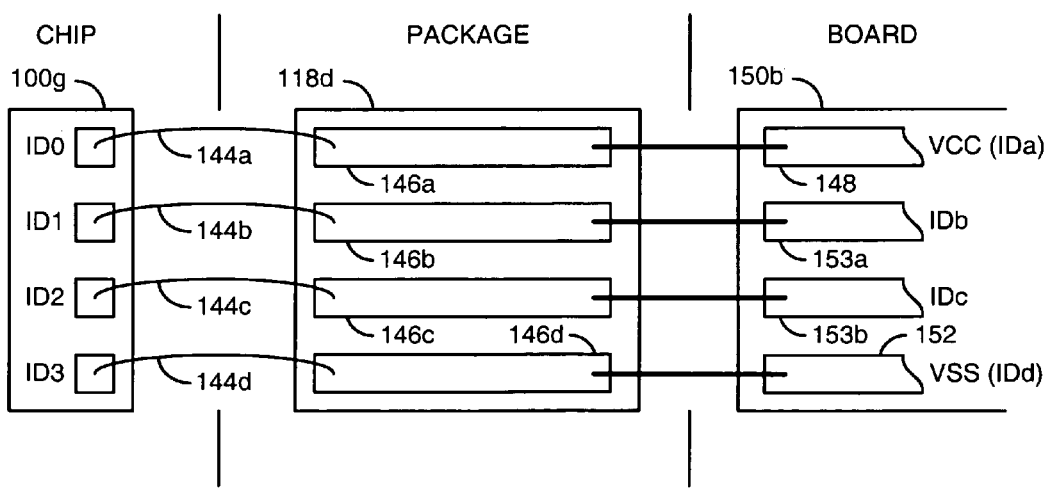
FIG. 11 is a fourth example structure for configuring the identification signal.

Referring to FIG. 11, a fourth example structure for configuring the signal ID is shown. A board 150b may generate and provide the power signal VCC, the second bit signal IDb, the third bit signal IDc and the ground signal VDD to the signal traces 146a–d respectively. The signal traces 146a–d may transfer the information to the chip 100 via the bonds 144a–d respectively. The fourth example structure generally allows for the signal ID to be controlled by a user from the board 150b. In the particular example, some of the bits of the signal ID may be fixed by the power and ground traces 148 and 152 of the board 150b while other signals may be on separate traces 153a–b that may be configured to carry adjustable values.

Figure 12:
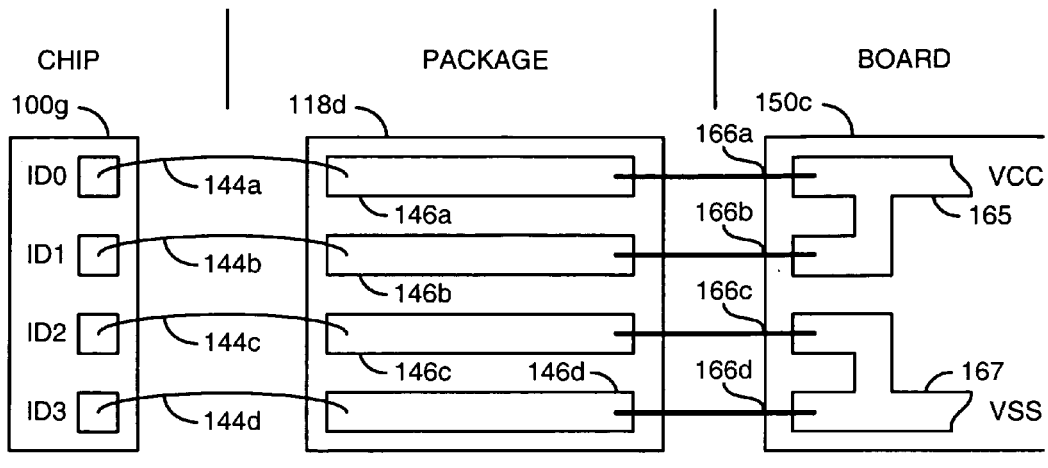
FIG. 12 is a fifth example structure for configuring the identification signal.

Referring to FIG. 12, a fifth example structure for configuring the signal ID is shown. A board 150c may have an interface 166a–d for each pin, ball, or tab of the package 118b. Each interface may be connected to one of a power trace 165 or 167 to generate the value of the signal ID. Selection of the signal ID may thus be fixed by a pattern in the metal layers of the board 150c.

Figure 13:
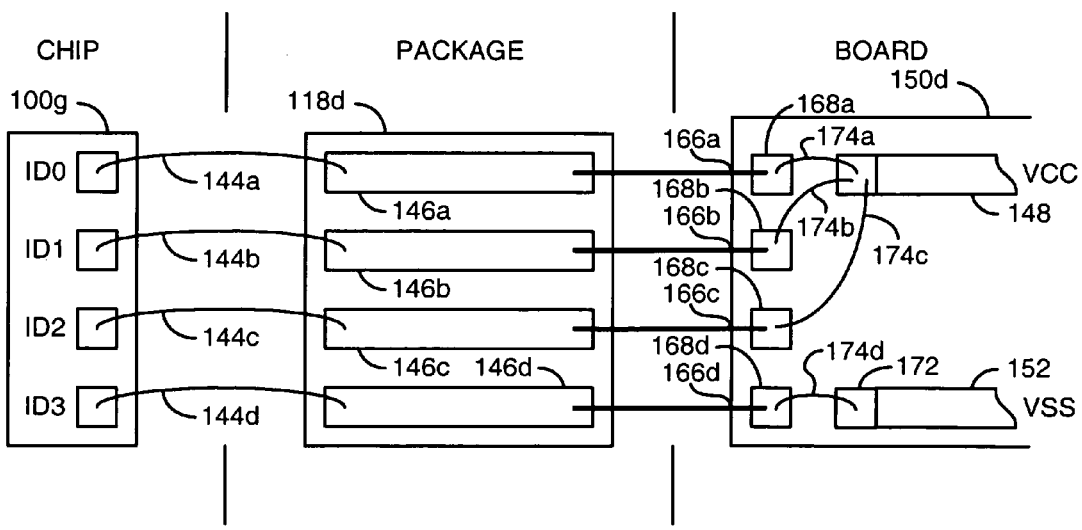
FIG. 13 is a sixth example structure for configuring the identification signal.

Referring to FIG. 13, a sixth example structure for configuring the signal ID is shown. A board 150d may have the interface 166a–d for each pin of the package 118b. Each interface 166a–d may be connected to a jumper element 168a–d on the board 150d. Likewise, each power trace 148 and 152 may be connected to a jumper element 170 and 172. Jumpers 174a–d, such as wire wrap wires, switch poles, resistors, wires, or the like may be connected between each of the jumper elements 168a–d and one of the jumper elements 170 or 172 to configure the signal ID.

Figure 14:
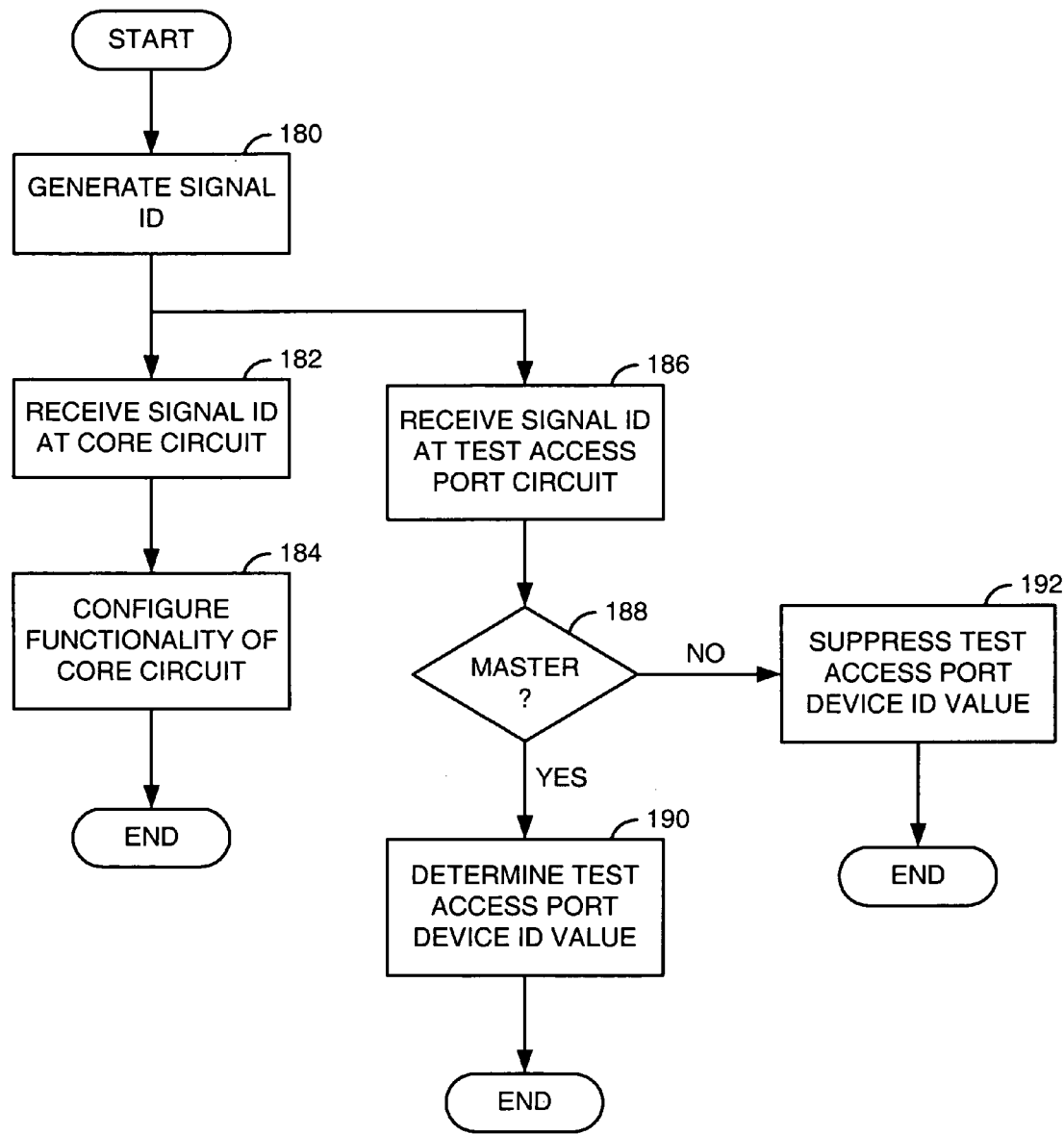
FIG. 14 is a flow diagram of a method of operating a chip.

Referring to FIG. 14, a flow diagram of a method of operating the chip 100 is shown. The method generally begins by generating a value for the signal ID (e.g., block 180). The value may be generated directly, or several potential values may be generated and a particular value may be routed to the chip 100. In response to reception of the signal ID by the core circuit 102 (e.g., block 182), the core circuit 102 may configure among a plurality of possible functions based upon the value of the signal ID (e.g., block 184). In response to reception of the signal ID by the test access port circuit 104 (e.g., block 186), the test access port circuit 104 may check to see if the chip 100 may be a master or a slave (e.g., decision block 188). If the chip 100 is a master of a multi-chip package 118 or the only chip 100 in a single-chip package 118 (e.g., the YES branch of decision block 188), the associated test access port circuit 104 may generate a unique JTAG ID value based upon the signal ID (e.g., block 190). If the chip 100 is a slave (e.g., the NO branch of decision block 188), the associated boundary scan or test access port circuit 104 may suppress, withhold, or eliminate the JTAG ID value from the scan chain (e.g., block 192).

With the present invention, a derivative product may be created with a unique substrate/package, a unique bond wire configuration on a common substrate, and/or a unique set of connections of the package pins to power and ground signals or high impedance opens. The configuration ability may be useful when developing derivative products that share some common functionality. Advantages of derivative products to a customer may include low power, small package parts, low cost, and/or good availability. Advantages of the derivative products to a manufacturer may include a short time-to-market, few masks, few test programs, and a large product portfolio. The ability to quickly produce the derivative products from a base chip design may reduce overhead because design and manufacturing personnel may only have to design and build a single chip. Therefore, very short project cycles on the derivative parts may be achieved due to reliance on the testing and qualification of the flagship product (the part that developed the original chip that the derivatives are using). The features and advantages of the present invention may include, but are not limited to the following:

A way to enable multiple product JTAG IDs from a chip without modifying the chip.

A way to enable multiple product JTAG IDs from a chip with alternate bond-wire configurations.

A way to enable multiple product JTAG IDs from a chip with alternate package substrate wiring.

A way to enable multiple product JTAG IDs from a chip with alternate package substrate routing.

A way to enable multiple product JTAG IDs from a chip with alternate package to end-user board connections.

A way to enable multiple product JTAG IDs from a chip through use of external memories.

A way to enable multiple product JTAG IDs from a chip through an on-chip boot ROM.

A way to enable multiple product JTAG IDs from a chip by optical ablation programming.

A way to enable multiple product JTAG IDs from a chip by electrical overstress programming.

A way to enable multiple product JTAG IDs from a chip by optical annealing of antifuses.

A way to enable multiple product JTAG IDs from a chip by charge trapping in nonvolatile storage cells.

A way to enable multiple product JTAG IDs from a chip by storing logic levels in magnetic domains.

A way to interconnect multiple chips on a substrate where at least one chip may be test access port capable and the JTAG ID value may be configurable through the previously described methods.

A way to interconnect multiple chips on a substrate where more than one chip may be test access port capable and the entire packaged part generally responds with a single JTAG ID value, and the JTAG ID value may be configurable.

A way to interconnect multiple chips on a substrate where all of the chips may have test access port capabilities and the entire packaged part may respond with a single JTAG ID value, and the JTAG ID value may be configurable.

A way to configure functionality of a chip among multiple functions.

A way to configure a common chip as one of several derivative products.

The present invention may enable a quick expansion of a product portfolio of a product or series of products (assuming that the products implement test access port functionality). Assuming that the die area may not be prohibitive, single and dual channel devices may be developed quickly using quad or n-channel designs (where n is an integer). Highly configurable designs may be "stripped" down by package configuration, enabling reduced functionality devices using a common die. In multi-die configurations, the entire package may respond as a single JTAG ID not being the same as that of any of the individual chips. The single JTAG ID value may shield confidential information from the customer about how the device may be constructed.

The various signals of the present invention are generally "on" (e.g., a digital HIGH, or 1), "off" (e.g., a digital LOW, or 0), or "open" (e.g., not connected or high impedance). However, the particular polarities of the on (e.g., asserted) and off (e.g., de-asserted) states of the signals may be adjusted (e.g., reversed) accordingly to meet the design criteria of a particular implementation. Additionally, inverters may be added to change a particular polarity of the signals.

The various signals of the present invention are generally shown on individual inputs and outputs. In other embodiments, some or all of the various signals may be multiplexed through one or more inputs and/or outputs as desired or required. Furthermore, the various signals of the present invention may be implemented as single-bit or multi-bit signals in a serial and/or parallel configuration. As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the spirit and scope of the invention.

The invention claimed is:

1. An apparatus comprising:
    a chip having (i) a core circuit configurable among a plurality of functions in response to a signal and (ii) a test access port circuit configured to determine an identification value in response to said signal, wherein said signal has a width of at least one bit;
    a package (i) enclosing said chip, (ii) having at least one signal trace configured to carry said at least one bit of said signal respectively, (iii) a plurality of reference traces each having a unique value and (iv) at least one jumper coupling a respective one of said at least one signal trace to one of said reference traces; and
    another chip having another test access port circuit (i) interfacing with another core circuit and (ii) configured to suppress another identification value in response to said signal.

2. The apparatus according to claim 1, further comprising a circuit board configured to bias said reference traces to generate said at least one bit of said signal.

3. The apparatus according to claim 2, further comprising a plurality of interfaces on said circuit board each having one of said unique values, wherein one of said interfaces is connected to said at least one signal trace.

4. The apparatus according to claim 1, wherein said at least one bit comprises a plurality of bits, said apparatus further comprising a bond connecting a second bit of said plurality of bits directly to one of said reference traces.

5. A method of operating a circuit, comprising the steps of:
    (A) receiving a signal;
    (B) configuring a chip of said circuit among a plurality of functions in response to said signal;
    (C) determining a test access port identification value for said chip in response to said signal, said test access port identification value comprising a plurality of digital bits;
    (D) generating said signal external to said chip; and
    (E) suppressing another test access port identification value for another chip of said circuit in response to said signal.

6. The method according to claim 5, further comprising the step of generating a plurality of values for said signal external to said chip, wherein one of said values is received by said chip.

7. An apparatus comprising:
    a chip having (A) a core circuit configurable among a plurality of functions in response to a signal, B a test access port circuit configured to determine an identification value in response to said signal and (C) a bond connecting said chip to one of a plurality of traces each (i) carrying a unique value for said signal and (ii) external to said chip; and
    another chip having another test access port circuit (A) interfacing with another core circuit and (B) configured to suppress another identification value in response to said signal.

8. The apparatus according to claim 7, wherein a memory circuit enclosed in a common package with said chip is configured to generate said signal.

9. The apparatus according to claim 8, wherein said memory circuit comprises an optical memory circuit.

10. The apparatus according to claim 8, wherein said memory circuit comprises a magnetic memory circuit.

11. The apparatus according to claim 7, wherein a fuse programmable link is configured to generate said signal.

12. The apparatus according to claim 7, wherein an antifuse programmable link is configured to generate said signal.

13. The apparatus according to claim 7, wherein said identification value comprises a Joint Test Action Group product identification value.

14. An apparatus comprising:
   a first core circuit configurable among a plurality of functions in response to a signal having a multi-bit width;
   a first test access port circuit configured to determine a first identification value in response to said signal;
   a second core circuit;
   a second test access port circuit (i) interfacing with said second core circuit and (ii) configured to suppress a second identification value in response to said signal;
   a package (i) enclosing said first core circuit, said second core circuit, said first test access port and said second test access port and (ii) having a plurality of signal traces configured to carry said signal; and
   a plurality of jumpers in said package coupling said signal traces to a plurality of reference traces to generate a unique value for said signal.

15. The apparatus according to claim 14, wherein said reference traces comprises:
   a high reference trace carrying a high voltage; and
   a low reference trace carrying a low voltage.

16. The apparatus according to claim 14, wherein said jumpers comprise a plurality of wire bonds.

17. The apparatus according to claim 14, wherein each of said jumpers comprise a trace between a respective one of said signal traces and one of said reference traces.

18. A method of operating a circuit, comprising the steps of:
   (A) receiving a signal;
   (B) configuring a chip of said circuit among a plurality of functions in response to said signal;
   (C) determining a test access port identification value for said chip in response to said signal, said test access port identification value comprising a plurality of digital bits;
   (D) generating said signal external to said chip; and
   (E) generating a plurality of values for said signal external to said chip, wherein only one of said values is received by said chip.

19. The method according to claim 18, further comprising the step of suppressing another test access port identification value for another chip of said circuit in response to said signal.

* * * * *